US011091365B2

(12) United States Patent
Huang et al.

(10) Patent No.: US 11,091,365 B2
(45) Date of Patent: Aug. 17, 2021

(54) MEMS PACKAGE STRUCTURE AND MANUFACTURING METHOD THEREOF

(71) Applicant: ADVANCED SEMICONDUCTOR ENGINEERING, INC., Kaosiung (TW)

(72) Inventors: Ching-Han Huang, Kaohsiung (TW); Lu-Ming Lai, Kaohsiung (TW)

(73) Assignee: ADVANCED SEMICONDUCTOR ENGINEERING, INC., Kaosiung (TW)

(*) Notice: Subject to any disclaimer, the term of this patent is extended or adjusted under 35 U.S.C. 154(b) by 0 days.

(21) Appl. No.: 14/500,629

(22) Filed: Sep. 29, 2014

(65) Prior Publication Data
US 2015/0091108 A1 Apr. 2, 2015

(30) Foreign Application Priority Data

Sep. 30, 2013 (CN) ............ 201310468547.X

(51) Int. Cl.
*B81B 7/00* (2006.01)
(52) U.S. Cl.
CPC .......... *B81B 7/0061* (2013.01); *B81B 7/0058* (2013.01); *B81B 2201/0257* (2013.01); *B81B 2207/012* (2013.01); *H01L 2224/48091* (2013.01); *H01L 2224/48137* (2013.01); *H01L 2224/49109* (2013.01)
(58) Field of Classification Search
CPC ............ H01L 29/84; H04R 11/04; B81B 7/00
See application file for complete search history.

(56) References Cited

U.S. PATENT DOCUMENTS

| 4,604,677 | A | 8/1986 | Suzuki et al. |
| 6,404,120 | B1* | 6/2002 | Aben ............... C03C 17/009 313/477 R |
| 2005/0185812 | A1* | 8/2005 | Minervini ........... B81B 7/0064 381/355 |

(Continued)

FOREIGN PATENT DOCUMENTS

| CN | 101026902 A | 8/2007 |
| CN | 101282594 | 10/2008 |

(Continued)

OTHER PUBLICATIONS

Search Report from corresponding Chinese Patent Application No. 201310468547X, dated Jan. 4, 2017, 1 page.

(Continued)

*Primary Examiner* — Lex H Malsawma
*Assistant Examiner* — Geoffrey H Ida
(74) *Attorney, Agent, or Firm* — Foley & Lardner LLP

(57) ABSTRACT

The present disclosure provides a package structure and a manufacturing method. The package structure includes a substrate, a cover, a conductive pattern, and a sensing component. The cover is disposed on the substrate. The cover and the substrate define an accommodation space. The conductive pattern includes a conductive line. The conductive line is disposed on an internal surface of the cover exposed by the accommodation space, and is electrically connected to the substrate. The sensing component is disposed on the internal surface of the cover, and is electrically connected to the conductive line.

19 Claims, 5 Drawing Sheets

(56) References Cited

U.S. PATENT DOCUMENTS

| | | | |
|---|---|---|---|
| 2007/0222056 A1* | 9/2007 | Bauer | B81C 1/0023 257/687 |
| 2008/0083957 A1 | 4/2008 | Wei et al. | |
| 2008/0144863 A1* | 6/2008 | Fazzio | B81B 7/0061 381/190 |
| 2008/0298621 A1 | 12/2008 | Theuss et al. | |
| 2009/0257614 A1* | 10/2009 | Mei | H04R 19/04 381/355 |
| 2010/0067732 A1* | 3/2010 | Hachinohe | B81B 7/0061 381/394 |
| 2010/0246877 A1 | 9/2010 | Wang et al. | |
| 2011/0293128 A1 | 12/2011 | Kuratani et al. | |
| 2012/0212925 A1 | 8/2012 | Zoellin et al. | |
| 2013/0028450 A1 | 1/2013 | Cortese et al. | |
| 2013/0082368 A1 | 4/2013 | Kim et al. | |
| 2013/0154066 A1 | 6/2013 | Kim et al. | |
| 2014/0002964 A1* | 1/2014 | Li | G02B 26/001 361/679.01 |
| 2014/0355101 A1* | 12/2014 | Shian | G02B 3/12 359/290 |

FOREIGN PATENT DOCUMENTS

| | | |
|---|---|---|
| CN | 101282594 A | 10/2008 |
| CN | 102131139 A | 7/2011 |
| CN | 102275861 A | 12/2011 |
| CN | 102649535 A | 8/2012 |
| CN | 102742301 A | 10/2012 |
| CN | 103024651 A | 4/2013 |
| CN | 103035620 A | 4/2013 |
| JP | 2010-166307 A | 7/2010 |

OTHER PUBLICATIONS

Decision of rejection in corresponding Chinese Patent Application No. 201310468547.X, dated Mar. 1, 2019, 14 pages.

Search Report with English Translation in related Chinese Patent Application No. 2019105134908.8, dated Jun. 2, 2021, 5 pages.

* cited by examiner

MEMS PACKAGE STRUCTURE AND MANUFACTURING METHOD THEREOF

CROSS REFERENCE TO RELATED APPLICATIONS

This application claims the benefit of Chinese Patent Application No. 201310468547.X, filed 30 Sep. 2013, the contents of which are incorporated herein by reference in their entirety.

BACKGROUND

1. Technical Field

The present disclosure relates to a package structure and a manufacturing method thereof, and in particular, to a Micro Electro Mechanical System (MEMS) package structure and a manufacturing method thereof

2. Description of the Related Art

Semiconductor industry has developed rapidly in recent years, and along with rapid changes of electronic technologies and successive creations of hi-tech electronic industries, electronic products continue to be updated with improved functions, and are designed towards the trend of being light, thin, short and small.

Generally, a MEMS packaging technology uses a metal cover to cover a substrate. However, due to structural and process factors, the metal cover has a limited capability of being scaled down for smaller volume, and has a high manufacturing cost. Moreover, in order to avoid electronic devices on the substrate from contacting with the metal cover and become short circuited, an accommodation space of the metal cover should be designed to be large enough, so as to ensure that a spaced gap exists between the metal cover and the electronic devices, which further blocks the goal of miniaturization.

SUMMARY

One embodiment of the present disclosure is directed to a package structure. The package structure includes a substrate, a cover, a conductive pattern, and a sensing component. The cover is disposed on the substrate. The cover and the substrate define an accommodation space. The conductive pattern includes a conductive line. The conductive line is disposed on an internal surface of the cover facing the accommodation space, and is electrically connected to the substrate. The sensing component is disposed on the internal surface of the cover, and is electrically connected to the conductive line.

In another embodiment, the package structure includes a substrate, a polymeric cover, a conductive pattern, and a conductive joint. The polymeric cover is mounted to the substrate to define an accommodation space therebetween, and the polymeric cover defines a sensing channel. The conductive pattern is disposed on an internal surface of the polymeric cover facing the accommodation space, and the conductive joint is disposed between the cover and the substrate and electrically connects the conductive pattern to the substrate.

Another embodiment of the present disclosure is directed to a manufacturing method of a package structure. The manufacturing method includes: providing a cover, the cover defining an accommodation space; forming a conductive line on an internal surface of the cover exposed by the accommodation space; disposing a sensing component on the internal surface of the cover, and electrically connecting the sensing component to the conductive line; and disposing the cover on a substrate, the accommodation space facing the substrate.

BRIEF DESCRIPTION OF THE DRAWINGS

Common reference numerals are used throughout the drawings and the detailed description to indicate the same or similar elements. The present disclosure will be more apparent from the following detailed description taken in conjunction with the accompanying drawings.

DETAILED DESCRIPTION

Figure 1A:
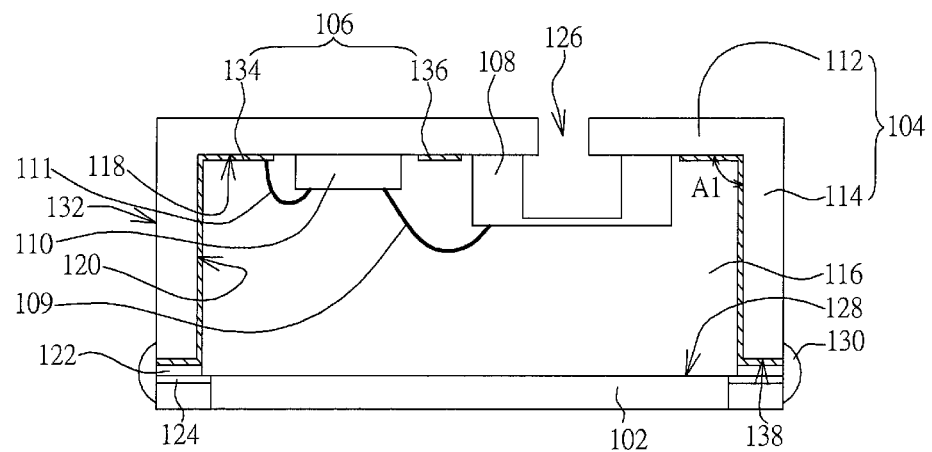
FIG. 1A shows a cross-sectional schematic view of a package structure according to an embodiment.

Referring to FIG. 1A, a cross-sectional view of a package structure according to an embodiment is shown. The package structure includes a substrate 102, a cover 104, a conductive pattern 106, a sensing component 108, and a chip 110.

The cover 104 is disposed on, or mounted to, the substrate 102. The cover 104 includes a top part 112 and a sidewall part 114 adjoining to each other. The cover 104 and the substrate 102 define an accommodation space 116. The accommodation space 116 is a gap, such as a gap filled with air. An included angle A1 formed between an internal surface 118 of the top part 112 and an internal surface 120 of the sidewall part 114 is about 90° as shown in FIG. 1A, but is not limited to a right angle and may also be other suitable angles or shapes; for example, another angle may be an obtuse angle greater than 90°.

The material of the cover 104 is a high-molecular weight polymeric material, such as a liquid crystal polymer, polyphenylene sulfide, high performance polyamide or other suitable thermoplastic polymeric materials. In some embodiments, a liquid crystal polymer refers to a class of aromatic polyester polymers having high chemical inertness and high strength, such as an elastic modulus in the range of about 8530 MPa to about 17200 MPa, a tensile strength in the range of about 52.8 MPa to about 185 MPa, or both. In some embodiment, an outer surface of the cover 104 further includes a metal layer (not shown) disposed or formed thereon to increase the strength of the cover 104. In some embodiments, the cover 104 is a molded structure formed of a polymer. In some embodiments, the polymer is mixed with an electromagnetic wave shielding material, and therefore, the cover 104 has an electromagnetic interference (EMI) shielding effect. For example, the electromagnetic wave shielding material may include fiberglass. The electromagnetic wave shielding material also may include a ferrite material such as iron oxide ($Fe_2O_3$ or $Fe_3O_4$), iron-nickel alloy, and iron-manganese alloy; or soft ferrite such as manganese-zinc ferrite (MnZn or more generally $Mn_xZn_y$,)

and nickel-zinc ferrite (NiZn or more generally $Ni_xZn_y$); or inductive ferrite such as nickel ferrite, cobalt-nickel ferrite, strontium ferrite, cobalt ferrite, and barium ferrite. Different ferrites may be included to inhibit electromagnetic waves in different wavebands and convert the electromagnetic waves into thermal energy to be dissipated. In some embodiments, the electromagnetic wave shielding material includes one or more of silicon carbide (SiC), silicon oxide ($SiO_2$), and silicon nitride ($S_{i3}N_4$), and by using the characteristics of absorbing electromagnetic waves and microwaves, effectively absorbs electromagnetic waves and converts the absorbed electromagnetic waves into thermal energy, so as to provide electromagnetic wave shielding. The electromagnetic wave shielding material may be in particulate, powder or in other suitable forms. Appropriate selection on the electromagnetic wave shielding material can allow the package structure to effectively shield EMI.

The conductive pattern 106 is disposed on an internal surface 118 and/or 120 of the cover 104. The internal surface 118 and/or 120 is exposed by, or faces, the accommodation space 116. The conductive pattern 106 may be electrically connected to a conductive connecting pad 124 of the substrate 102 through a conductive joint 122. The conductive joint 122 may be solder, conductive adhesive, or the like, and may be physically and electrically connected to the conductive pattern 106 and the conductive connecting pad 124.

The sensing component 108 and the chip 110 are disposed on, or mounted to, the cover 104.

In an embodiment, the package structure is a MEMS package structure. The sensing component 108 includes an induction chip including an induction thin film, such as a MEMS microphone or a MEMS pressure sensor. The cover 104 defines a through hole 126 to connect the internal accommodation space 116 and an external space outside the cover 104. The through hole 126 of the cover 104 is a channel providing an induction signal source, for example, sound wave, to transmit from the external space into the accommodation space 116, so as to be sensed by the sensing component 108. The sensing component 108 is disposed to be corresponding to the through hole 126. In some embodiments, the sensing component 108 is designed to be closely aligned with the through hole 126, so that the sensing component 108 can receive a stronger signal, thereby improving sensing efficiency. The position of the through hole 126 may be appropriately adjusted according to product requirements; for example, it can be designed in the top part 112 of the cover 104, or in the sidewall part 114. As another example, the through hole 126 can be designed at a position near a signal source (for example, a user), so as to receive stronger signal intensity. In some embodiments, the sensing component 108 is disposed to be corresponding and beneath the through hole 126, as shown in FIG. 1A; thus the sensing component 108 can directly receive the signal source, so as to strengthen the signal intensity and improve the Signal to Noise Ratio (SNR). The sensing component 108 may be appropriately disposed at other positions.

In an embodiment, the chip 110 is an Application Specific Integrated Circuit (ASIC), and is electrically connected to the conductive pattern 106. The sensing component 108 and the chip 110 may be respectively adhered or mounted to the cover 104 by using an insulating adhesive through die bonding. A wire 109 is used to electrically connect the sensing component 108 and the chip 110, and a wire 111 is used to electrically connect the chip 110 and the conductive pattern 106. The material of the wires 109, 111 includes copper, gold, or other suitable materials. In another embodiment, the chip 110 may be disposed in a flip-chip manner, and is electrically connected to the conductive pattern 106 by using a bonding solder. In an embodiment, the chip 110 may be packaged and protected by using an insulating adhesive (not shown). In another embodiment, the sensing component 108 may be disposed in a flip-chip manner, and is electrically connected to the conductive pattern 106 by using a bonding solder.

It is not limited for the sensing component 108 and the chip 110 to be disposed on the same surface 118 of the top part 112 of the cover 104, as shown in FIG. 1A. In other embodiments, the sensing component 108 and the chip 110 may be respectively disposed on the sidewall part 114 of the cover 104 and an upper surface 128 of the substrate 102; respectively disposed on the upper surface 128 of the substrate 102 and the sidewall part 114 of the cover 104; respectively disposed on the top part 112 of the cover 104 and the upper surface 128 of the substrate 102; respectively disposed on the upper surface 128 of the substrate 102 and the top part 112 of the cover 104; respectively disposed on the sidewall part 114 of the cover 104 and the top part 112 of the cover 104; respectively disposed on the top part 112 of the cover 104 and the sidewall part 114 of the cover 104; disposed on the same or different (coplanar or non-coplanar) sidewall part 114 of the cover 104; or disposed in other appropriate manners. Therefore, the configuration design of devices in the accommodation space 116 has large flexibility, so that the space 116 is well utilized to reduce the volume of the package structure.

In an embodiment, the chip 110 is not disposed in the accommodation space 116, but is disposed on the substrate 102 outside the cover 104, and is electrically connected to the sensing component 108 in the accommodation space 116 by using a conductive component in the substrate 102 and/or the conductive pattern 106. This concept may also be applied to other chips not shown in FIG. 1A. In other embodiments, other devices may also be disposed in the accommodation space 116, such as chips or passive components having different functions.

The package structure may include an encapsulant 130, which at least encapsulates an adjoining position of the upper surface 128 of the substrate 102 and an outer surface 132 of the cover 104.

Figure 1B:
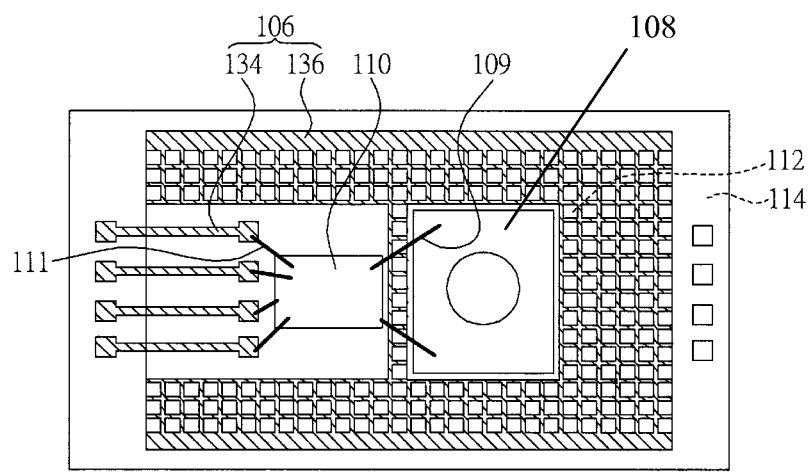
FIG. 1B shows a top schematic view of a package structure according to an embodiment.

Referring to FIG. 1B, a top view of a package structure according to an embodiment is shown. The conductive pattern 106 includes a conductive line or trace 134 and a conductive shield layer 136 electrically insulated or separated from each other, which may be appropriately disposed on the internal surfaces 118, 120 (FIG. 1A) of the top part 112 and/or the sidewall part 114 of the cover 104. In an embodiment, the conductive shield layer 136 is electrically insulated from the sensing component 108 and the chip 110. The conductive shield layer 136 is not limited to the mesh shape shown in the drawing, and may also be rectangular, or in other suitable forms. The sensing component 108 may be electrically connected to the chip 110 through the wire 109. The chip 110 is electrically connected to the conductive line 134 through the wire 111. In an embodiment, the conductive line 134 and the conductive shield layer 136 are extended to a lower surface 138 of the sidewall part 114 (FIG. 1A), so as to be electrically connected to the conductive connecting pad 124 of the substrate 102 through the conductive joint 122, and respectively electrically connected to other signal terminals through lines connected to the conductive connecting pad 124. In an embodiment, the conductive shield layer 136 is thereby electrically connected to a ground terminal, so as to provide an EMI shielding efficacy. In an embodiment, the conductive pattern 106 includes one or more conductive connecting pads or rings, such as for flip-chip bonding to either, or both, the sensing component 108 and the chip 110.

Figure 2:
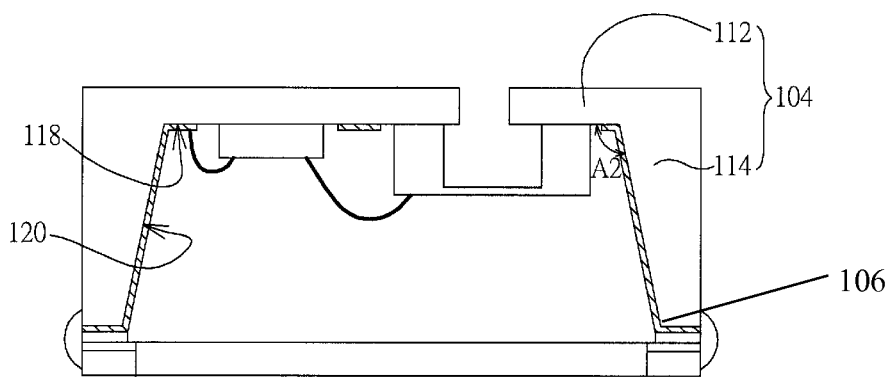
FIG. 2 shows a cross-sectional schematic view of a package structure according to an embodiment.

FIG. 2 shows a cross-sectional view of a package structure according to an embodiment, and a difference between FIG. 2 and FIG. 1A is described as follows. An obtuse angle A2 is formed between the internal surface 118 of the top part 112 of the cover 104 and the internal surface 120 of the sidewall part 114. Because the angle A2 between the surface 118 of the top part 112 and the surface 120 of the sidewall part 114 is an obtuse angle, the conductive pattern 106 may be formed on the cover 104 more rapidly. The angle A2 can be, for example, from about 91° to about 135°, from about 91° to about 130°, from about 91° to about 125°, from about 91° to about 120°, from about 91° to about 115°, from about 93° to about 110°, from about 93° to about 102°, or about 93°.

Figure 3:
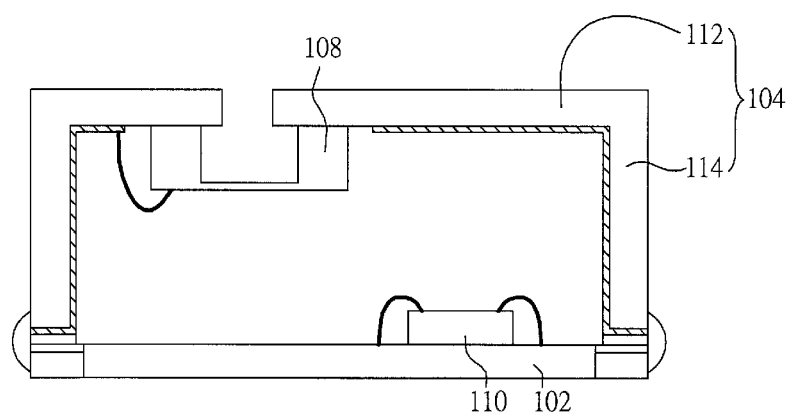
FIG. 3 shows a cross-sectional schematic view of a package structure according to an embodiment.

FIG. 3 shows a cross-sectional view of a package structure according to an embodiment, and a difference between FIG. 3 and FIG. 1A is described as follows. The sensing component 108 and the chip 110 are respectively disposed on the top part 112 of the cover 104 and the substrate 102.

FIG. 4A to FIG. 4D show cross-sectional schematic views illustrating manufacturing operations of a package structure according to an embodiment.

Figure 4A:
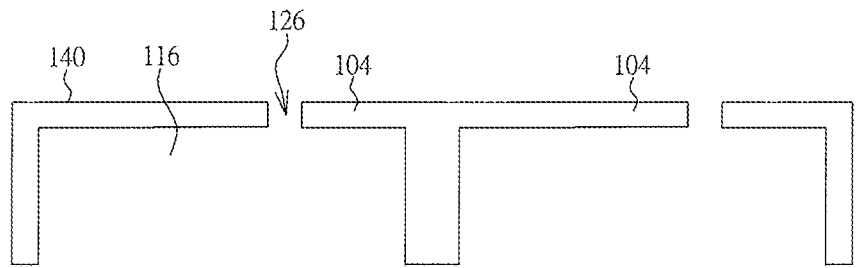
FIG. 4A, FIG. 4B, FIG. 4C and FIG. 4D show cross-sectional schematic views illustrating a manufacturing method of a package structure according to an embodiment.

Referring to FIG. 4A, a cover structure 140 including a plurality of covers 104 is formed. The covers 104 can be formed as a matrix-type panel or a strip. Each cover 104 defines a through hole 126, and defines an accommodation space 116 connected to the through hole 126. In an embodiment, the cover structure 140 is formed by injection molding so that a large area and a large number of covers 104 may be formed, and the method is rapid and low in cost and has reduced complexity. Further, the injection molding manner can precisely form the desired structure, for example, the small accommodation space 116, and therefore, it is conducive to reducing the size of the product. The material of the cover structure 140 may use any insulation material suitable for injection molding, for example, a macromolecule (e.g., a polymer). In some embodiments, the covers 104 may be formed by transfer molding.

Figure 4B:
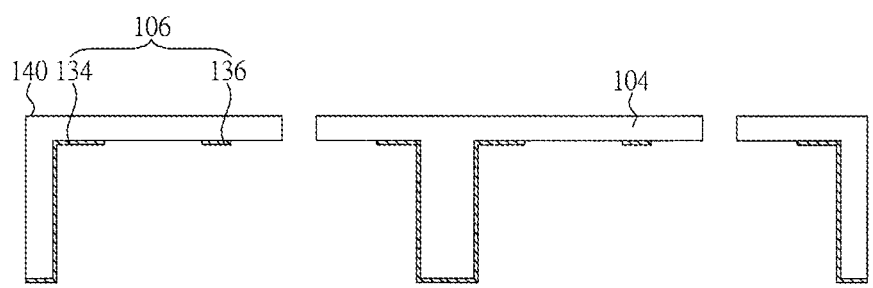

Referring to FIG. 4B, a conductive pattern 106 is formed on the cover 104. In an embodiment, the method of forming the conductive pattern 106 includes: forming a conductive film (not shown) on the cover structure 140, and patterning the conductive film, so as to form a conductive line 134 and a conductive shield layer 136 on each cover 104. The conductive film may be formed by electroplating, chemical plating, physical vapor deposition, or other suitable methods. A part of the cover 104 that is not intended to have the conductive film deposited may be covered by insulation tape, and the insulation tape is removed after the conductive film is deposited. The material of the conductive film may include a metal, a metal alloy, or other metal-containing material, such as gold, nickel, copper, tin, indium, platinum, chromium, aluminum, titanium, titanium nitride, chromium nitride, titanium carbonitride (TiCN), and stainless steel, and may be a single layer or a multi-layer structure. In an embodiment, the conductive film is patterned by using photolithography, so as to form the conductive line 134 and the conductive shield layer 136 at the same time or in a common manufacturing operation. In another embodiment, the conductive film is carved by laser. The conductive film may also be patterned by other suitable manners. In an embodiment, the conductive film may be deposited as a thin film having a thickness of, for example, up to about 200 µm, up to about 150 µm, up to about 100 µm, up to about 50 µm, up to about 10 µm, up to about 5 µm, up to about 1 µm, or up to about 500 nm, and down to about 100 nm or less, down to about 50 nm or less, or down to about 10 nm or less.

The cover structure 140 may be cut or singulated to separate the covers 104.

Figure 4C:
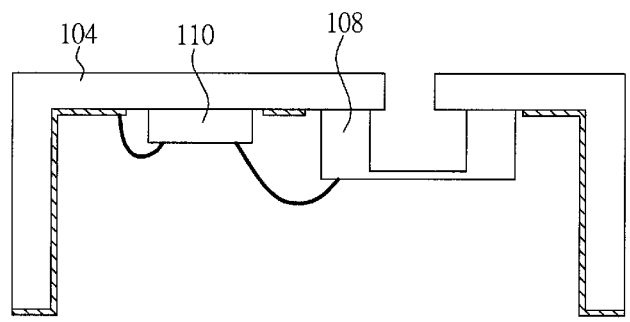

Referring to FIG. 4C, a sensing component 108 and a chip 110 are disposed on, or mounted to, the cover 104. The sensing component 108 and the chip 110 may be adhered to the cover 104 by using an insulating adhesive through die bonding, and may be cured through baking. The material of the adhesive may be epoxy or other suitable materials.

Figure 4D:
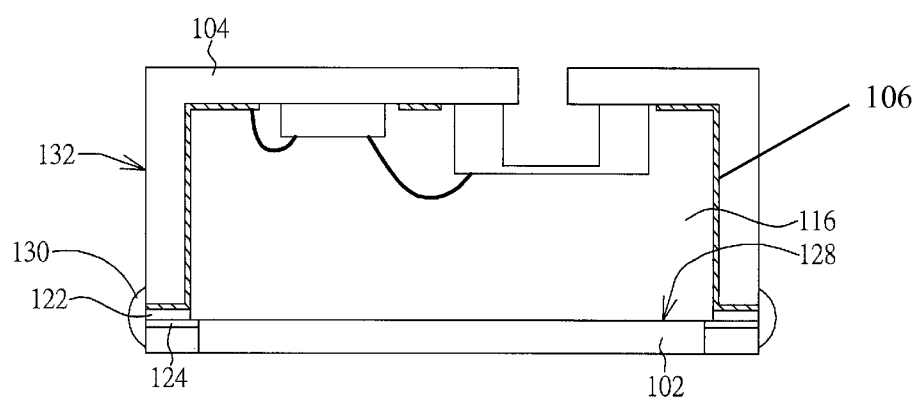

Referring to FIG. 4D, the cover 104 is disposed on, or mounted to, a substrate 102. The accommodation space 116 faces the substrate 102. The substrate 102 may include, for example, a printed circuit board (PCB), a SBS board, and the like. In an embodiment, a conductive joint 122 is disposed between the conductive pattern 106 and the conductive connecting pad 124 of the substrate 102, so as to physically and electrically connect the conductive pattern 106 to the conductive connecting pad 124. The conductive joint 122 includes solder, silver paste, or the like. In some embodiments, parts other than the joining position of the conductive pattern 106 and the conductive connecting pad 124 may also be applied with a non-conductive adhesive (not shown) to strengthen bonding of the cover 104 and the substrate 102. The structure may be cured by baking. An encapsulant 130 is used to cover the adjoining position of an upper surface 128 of the substrate 102 and an outer surface 132 of the cover 104.

Figure 5:
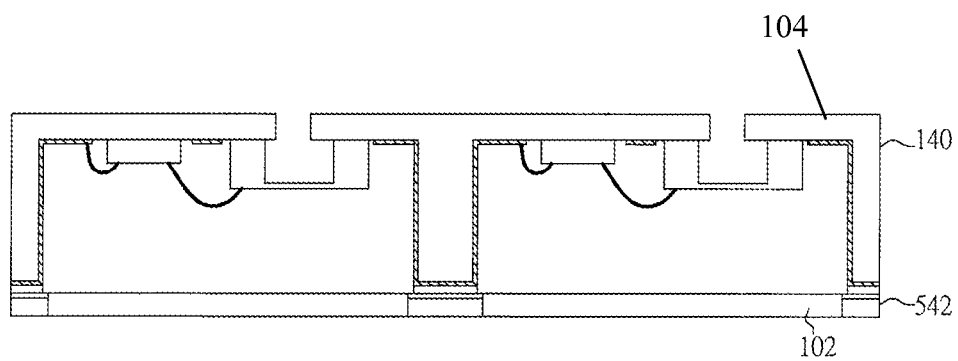
FIG. 5 shows a cross-sectional schematic view illustrating a manufacturing operation of a package structure according to an embodiment.

In other embodiments, as shown in FIG. 5, after the cover structure 140 having a large area is disposed on a substrate structure 542 formed by a plurality of substrates 102, a cutting or singulation operation is performed so as to obtain the package structure shown in FIG. 1A. The resulting package structure includes the substrate 102 and the cover 104 with aligned or co-planar outer surfaces. Compared with joining a single cover 104 and a single substrate 102, this method has a higher throughput (unit per hour, UPH).

As used herein, the terms "approximately," "substantially," "substantial" and "about" are used to describe and account for small variations. When used in conjunction with an event or circumstance, the terms can refer to instances in which the event or circumstance occurs precisely as well as instances in which the event or circumstance occurs to a close approximation. For example, the terms can refer to less than or equal to ±10%, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%.

Additionally, amounts, ratios, and other numerical values are sometimes presented herein in a range format. It is to be understood that such range format is used for convenience and brevity and should be understood flexibly to include numerical values explicitly specified as limits of a range, but also to include all individual numerical values or sub-ranges encompassed within that range as if each numerical value and sub-range is explicitly specified.

While the present disclosure has been described and illustrated with reference to specific embodiments thereof, these descriptions and illustrations are not limiting. It should be understood by those skilled in the art that various changes may be made and equivalents may be substituted without departing from the true spirit and scope of the present disclosure as defined by the appended claims. The illustrations may not be necessarily drawn to scale. There may be distinctions between the artistic renditions in the present disclosure and the actual apparatus due to manufacturing processes and tolerances. There may be other embodiments of the present disclosure which are not specifically illustrated. The specification and the drawings are to be regarded as illustrative rather than restrictive. Modifications may be made to adapt a particular situation, material, composition of matter, method, or process to the objective, spirit and scope of the present disclosure. All such modifications are intended to be within the scope of the claims appended hereto. While the methods disclosed herein have been described with reference to particular operations performed in a particular order, it will be understood that these operations may be combined, sub-divided, or re-ordered to form an equivalent method without departing from the teachings of the present disclosure. Accordingly, unless specifically indicated herein, the order and grouping of the operations are not limitations.

What is claimed is:

1. A package structure, comprising:
    a substrate;
    a cover comprising a top part and a sidewall part, the sidewall part being disposed on the substrate, the top part of the cover, the sidewall part of the cover and the substrate defining an accommodation space;
    a conductive pattern comprising a signal conductive line and a conductive shield layer, the signal conductive line disposed on an internal surface of the top part of the cover facing the accommodation space, the conductive shield layer electrically insulated from the signal conductive line, the signal conductive line extending along the top part and an internal surface of the sidewall part of the cover and electrically connected to the substrate; and
    a sensing component disposed directly on the internal surface of the top part of the cover, and electrically connected to the signal conductive line, wherein the conductive shield layer is disposed directly on the internal surface of the top part of the cover and spaced apart from the sensing component.

2. The package structure according to claim 1, further comprising a chip disposed on a surface facing the accommodation space, the surface on which the chip is disposed being different from the internal surface of the top part of the cover on which the sensing component is disposed.

3. The package structure according to claim 2, wherein the chip is disposed on an upper surface of the substrate.

4. The package structure according to claim 1, further comprising a chip disposed on the internal surface of the top part of the cover.

5. The package structure according to claim 1, wherein the cover is a molded structure comprising a polymer.

6. The package structure according to claim 1, wherein the substrate comprises a conductive connecting pad, and the package structure further comprises a conductive joint, the conductive joint being disposed between the cover and the substrate and being electrically connected to the conductive connecting pad and the signal conductive line.

7. The package structure according to claim 1, wherein the conductive shield layer is disposed on the internal surface of the top part of the cover, and electrically insulated from the sensing component.

8. The package structure according to claim 1, wherein the sensing component comprises a microphone chip or a pressure sensor.

9. The package structure according to claim 1, wherein the cover defines a through hole, and the sensing component is aligned with the through hole.

10. The package structure according to claim 1, wherein the cover is formed of a polymer mixed with a powder material.

11. The package structure according to claim 10, wherein the powder material is selected from fiberglass, iron oxide, iron-nickel alloy, iron-manganese alloy, manganese-zinc ferrite, nickel-zinc ferrite, nickel ferrite, cobalt-nickel ferrite, strontium ferrite, cobalt ferrite, barium ferrite, silicon carbide, silicon oxide, silicon nitride, or a combination thereof.

12. A package structure, comprising:
    a substrate;
    a polymeric cover comprising a top part and a sidewall part, the sidewall part of the polymeric cover mounted to the substrate such that the top part of the polymeric cover, the sidewall part of the polymeric cover, and the substrate to define an accommodation space therebetween, the polymeric cover defining a sensing channel;
    a conductive pattern comprising a signal conductive line and a conductive shield layer disposed on an internal surface of the polymeric cover facing the accommodation space, the conductive shield layer electrically insulated from the signal conductive line, the signal conductive line disposed on the top part and an inner surface of the sidewall part of the polymeric cover;
    a conductive joint disposed between the polymeric cover and the substrate and electrically connecting the conductive pattern to the substrate; and
    a sensing component mounted directly to the polymeric cover and disposed within the accommodation space, the sensing component being electrically connected to the conductive pattern;
    wherein the substrate has an upper surface facing the accommodation space, and the upper surface of the substrate is apart from the conductive shield layer of the conductive pattern.

13. The package structure according to claim 12, wherein the sensing component is aligned with the sensing channel.

14. The package structure according to claim 12, wherein the polymeric cover is formed of a polymer mixed with an electromagnetic wave shielding material.

15. The package structure according to claim 1, wherein the signal conductive line extends to a lower surface of the sidewall part of the cover.

16. The package structure according to claim 1, wherein the substrate has at least one outer surface that is co-planar with at least one outer surface of the cover.

17. The package structure according to claim 1, wherein the conductive shield layer extends to a lower surface of the sidewall part of the cover.

18. The package structure according to claim 1, wherein the conductive shield layer is electrically connected to a ground terminal for electromagnetic interference (EMI) shielding.

19. The package structure according to claim 1, wherein the cover includes a liquid crystal polymer having an elastic modulus of at least 8530 megapascal (MPa).

* * * * *